United States Patent [19]

Horn et al.

[11] Patent Number: 4,588,966

[45] Date of Patent: May 13, 1986

[54] IMAGE LINE VOLTAGE CONTROLLED OSCILLATOR WITH REPLACEABLE COMPONENTS

[75] Inventors: Robert E. Horn, Middletown, N.J.; Harold Jacobs, deceased, late of West Long Branch, N.J., by Lydia S. Jacobs, executrix; Hsieh T. Hao, Rumson, N.J.

[73] Assignee: The United States of America as represented by the Secretary of the Army, Washington, D.C.

[21] Appl. No.: 679,971

[22] Filed: Dec. 10, 1984

[51] Int. Cl.⁴ .............................................. H03B 5/18
[52] U.S. Cl. .............................. 331/96; 331/107 DP; 331/107 G
[58] Field of Search ................. 331/86, 90, 96, 107 R, 331/107 DP, 107 G; 333/232, 235

[56] References Cited

U.S. PATENT DOCUMENTS 3,882,419  5/1975  Swartz et al. ...................... 331/90

OTHER PUBLICATIONS

C. F. Klein, "Combine Varactor Control with Dielectric Tuning", Microwaves, vol. 15, No. 8, pp. 50-52, Aug. 1976.

Primary Examiner—Eugene LaRoche
Assistant Examiner—G. Wan
Attorney, Agent, or Firm—Anthony T. Lane; Jeremiah G. Murray; Maurice W. Ryan

[57] ABSTRACT

A millimeter wavelength oscillator combining a mechanically tunable resonating cavity oscillator element with an electronically tunable solid state diode element provides a basic stable steady wave energy source with fine-tuning capabilities not possible with a resonating cavity oscillator alone, and with an apparatus structure which is light in weight, compact, mechanically sturdy, and with easily accessible and quickly replaceable component parts.

7 Claims, 3 Drawing Figures

IMAGE LINE VOLTAGE CONTROLLED OSCILLATOR WITH REPLACEABLE COMPONENTS

The invention described herein may be manufactured, used, and licensed by or for the Government of the United States of America for Governmental purposes without the payment to us, or any of us, of any royalties thereon.

TECHNICAL FIELD

This invention relates to microwave diode radio frequency oscillators and, more particularly, to millimeter wavelength oscillators using solid state components. The field of practical utilization for the present invention will be in radar and communications circuits.

BACKGROUND OF THE INVENTION

Presently known and used millimeter wavelength oscillators generally use high frequency oscillator elements as their main source of wavelength generation. These devices include such diode elements as the Gunn diode or IMPATT diode which oscillate in metal cavities. In the frequency ranges of interest, that is to say 35 GHz to about 300 GHz, there are applications for oscillators for use in communications and radar applications. These applications of such oscillator devices, it may be generally stated, involve the use of a low power output and low values of voltage bias for the control of the electronic portion of the oscillators used. The relatively high operating frequencies and related short wavelengths of the outputs require extremely precise construction of the oscillator physical components. The casting and machining for the parts of such devices and apparatus is extremely costly, which limits the practical applications wherein the use of such devices is economically feasible.

In order to benefit from the relatively high stability of the mechanically tuned diode units such as Gunn oscillators and IMPATT diode oscillators, because of their mechanical adjustment and setting features, it would be desireable to provide some ancillary type of adjustment which would not rely on a mechanical setting operation and which could fine tune the total oscillator structure without disturbing its basic mechanical setting or its mechanically set frequency in the resonating cavity.

This, then, was the state of the art when we conceived and developed our invention with the principal object of providing a fine tuning ancillary component combined with the basic mechanically tuned and set oscillator used in a cavity resonating device.

A further object of the invention is to provide an adjustably tunable millimeter wave energy source which has substantially rugged, inexpensive, and readily replaceable components.

A still further and important object of the invention is to provide the combination according to our concept and development with discrete and replaceable individual components being readily and commercially available without the need for specialized manufacture, fabrication, or assembly.

The invention, then, provides a compact, low cost, mechanically tunable Gunn oscillator with additional electronic tuning through the use of a coupled and operably assembled varactor diode which is completely housed in the same heat sink, chassis or oscillator structure in which the basic Gunn diode element reposes or is mounted. By changing the bias on the varactor diode through controllable electronic circuitry, the basic or set point range of the Gunn oscillator can be fine-tuned with hitherto unattainable precision and accuracy to frequencies within useful ranges on either side of the Gunn diode set point frequency.

The apparatus and system of our invention has found particularly advantageous utilization as an image line voltage controlled oscillator.

SUMMARY OF THE INVENTION

In general, the invention according to our concept and development comprehends and oscillator which comprises, in combination, a housing having a resonating cavity, a solid state mechanically tunable element adjustably movably disposed in said housing and capable of producing a waveform energy output of a frequency relative to its position in said resonating cavity, the solid state electronically tunable element in circuit with and mounted proximally of said mechanically tunable element, position adjustment means on said mechanically tunable element operably accessible exteriorly of said housing, electrical bias sources operably connected respectively to each of the said tunable elements, bias variation control means to controllably vary the bias on at least the solid state electronically tunable element, and millimeter wavelength conductive circuit means arranged and disposed to conduct generated millimeter wave energy exteriorly of the oscillator. In particularly advantageously used embodiments of apparatus according to the invention, the solid state mechanically tunable element is threaddedly engaged in the housing and adjustably movable therein to vary the volume of the resonating cavity. In particular, the element used for this purpose is a Gunn diode.

It has also been found to use a varactor diode advantageously as the solid state electronically tunable element comprised in the apparatus. For ease of accessibility, maintenance, and replacement, it has also been found advantageous to install and mount such varactor diode internally of the housing and preferably on the lower cavity wall of the resonating cavity associated with a Gunn diode.

The foregoing and other distinctive and advantageous features of our invention will become the more readily apparent from the following detailed description of the invention in the light of the appended drawing figures.

BRIEF DESCRIPTION OF THE DRAWING

The invention will now be described in greater detail and with reference to the drawing appended hereto wherein.

DETAILED DESCRIPTION

Figure 1:
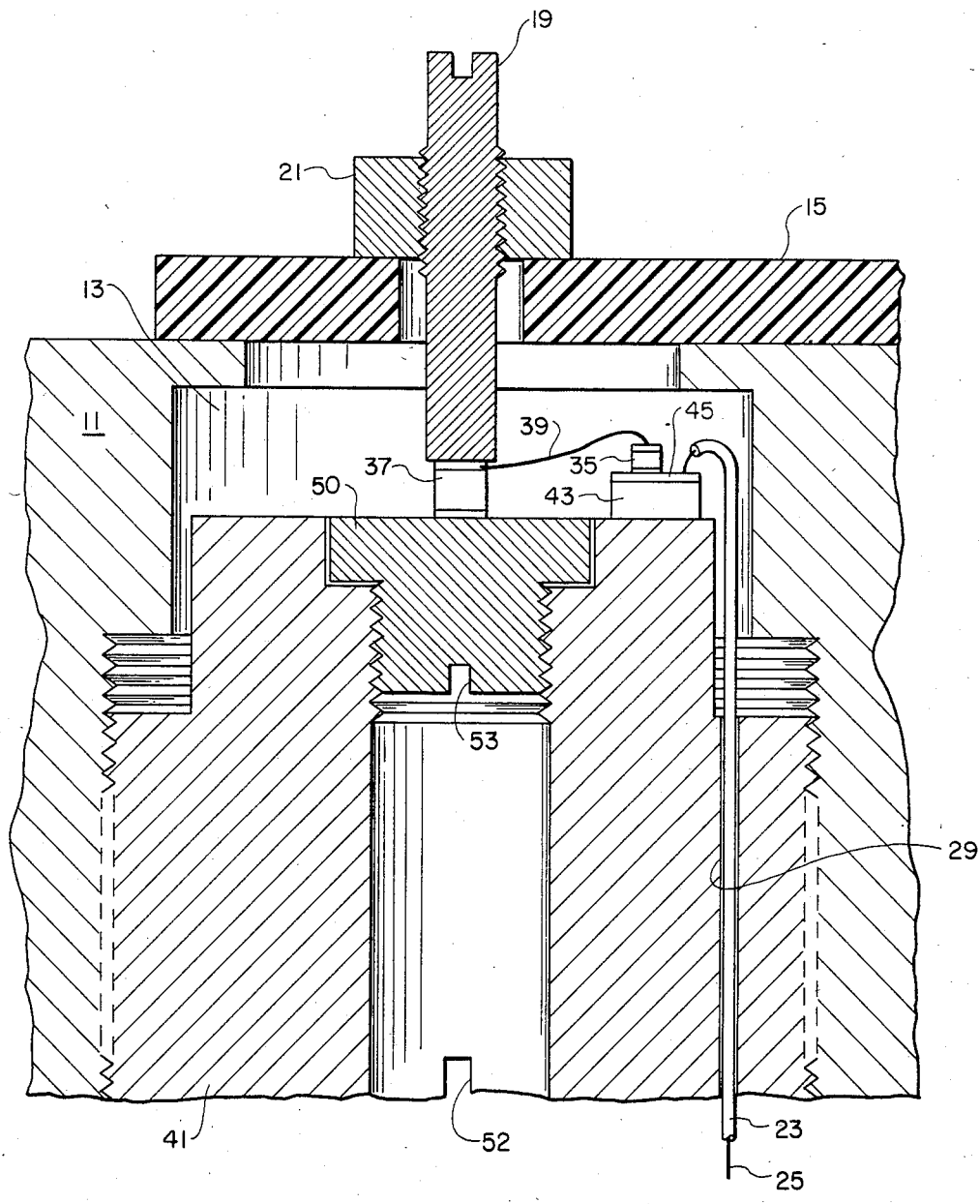
FIG. 1 is an elevational sectional view taken through the center of an apparatus embodiment according to the invention showing the relative relationships between the various mechanical and electrical elements thereof and a portion of the housing in which the structure mounts.
Figure 2:
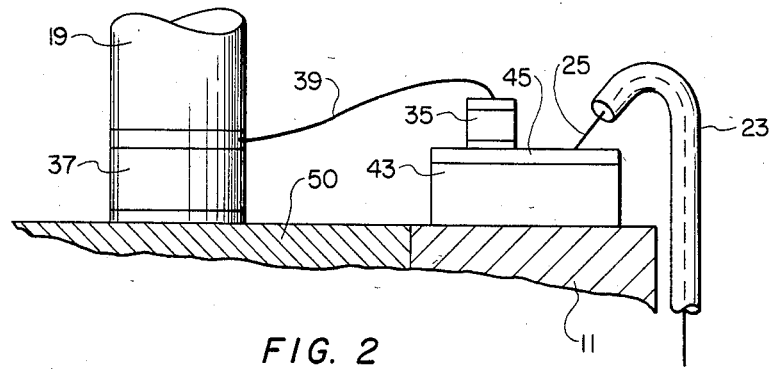
FIG. 2 is an enlarged view of a portion of FIG. 1 showing the manner in which the mechanically tunable diode element is connected electrically and juxtaposed physically with respect to the electronically tunable element.

Referring to drawing FIG. 1, the designation 11 indicates a housing such as a heat sink which mounts on a chassis or other base structure suitable for anchoring an oscillator structure according to this invention. Housing 11, as illustrated in part in FIG. 1, is bored and then counterbored to define a resonating cavity 13. The housing 11 is interiorly threaded to accomodate a cavity bottom closure plug or cylinder 41, exteriorly threaded to mount in and threadedly progress through the threaded bore portion of the cylindrical resonating cavity in housing 11. A small clearance may be provided between the smooth cylindrical wall of the counterbore defining resonating cavity portion and the outer cylindrical wall of the small diameter portion of the cavity bottom closure cylinder 41. With this arrangement, there is, in effect, a cavity 13 portion being cylindrical in form as illustrated in FIG. 1.

Cavity bottom closure cylinder 41 is provided with an adjusting screw slot 52 at the bottom portion thereof to facilitate turning the closure into and out of the threads in the large diameter bore with a suitable screwdriver means. The upper portion of cavity bottom closure cylinder 41 is drilled and tapped and counterbored to form a shoulder to accomodate the mounting of the lower diode element 37 of a Gunn diode.

The Gunn diode assembly comprises an adjusting post 19, an adjusting post mount 21 and the movable or lower electrode element 37, and a sub-element 50, sub-element 50 being advantageously provided with an adjusting slot 53. The Gunn diode assembly mounts concentrically in the apparatus with the post and lower electrode element arranged and disposed in the resonating cavity 13 as shown. Adjustment is accomplished by varying the position of the lower Gunn diode element 37, sub-element 50 and piston 41 in the cavity 13. The relative position of the piston will naturally affect the volumetric size of the resonating cavity 13 portion of the apparatus. The Gunn diode structure extends concentrically through a flanged opening in the upper portion of the resonating cavity and a power output plate 15, suitably conductive to the waveform energy being generated, is arranged and disposed atop the housing 11 and affords insulative mounting for the adjusting head for the Gunn diode as shown. Suitable bias is applied to the Gunn diode through the adjusting post by means of external circuitry not shown in the drawing.

On the upper circular surface of cavity bottom closure cylinder 41, and off to one side of the central axis and the Gunn diode assembly, a varactor diode 35 is mounted upon an insulator block or mount 43 which is securely affixed to said circular surface. A metal coating 45 or conductive sheet is interposed between the bottom element of the varactor diode and the insulator mount 43.

Oscillator coupling between the varactor diode 35 and the Gunn diode element 37 is accomplished by means of a wire 39 connecting these two elements as shown.

The varactor diode obtains its electrical bias through a coaxial cable 23. Coaxial cable 23 extends from the exterior of the device through a slot 29 in the side wall in cavity bottom closure cylinder 41 extending through the threaded portion thereof, and an opening between the outer cylindrical wall or cylinder 41 and the inner cylindrical wall of housing 11. The center conductor 25 of coaxial cable 23 attaches to the metal strip or plate 45 upon which varactor diode 35 mounts.

In operation, the Gunn diode is first tuned to the principal or main frequency desired by means of turning the threaded movable assemblies inwardly and/or outwardly in the resonating cavity 13, by means of a screwdriver or the like tool applied to the slot 52 in the bottom of cavity bottom closure cylinder 41 and in the top adjusting post 19 for the Gunn diode.

When the desired position of the Gunn diode movable portions in the cavity is achieved so that resonance at the desired frequency is obtained, the wave power output is available at the power output plate 15. At this juncture, the electrical bias on the varactor 35 may be tuned and varied until the precise frequency at the fine tuning point is attained or, in given instances, may be set appropriately to overcome any drift from the set frequency which may occur for whatever reason.

From the foregoing description and the drawing, it will be appreciated that the entire apparatus according to our invention is facilely disassembled and stripped for parts replacement and inspection. The individual components of the apparatus are readily accessible for inspection and or replacement under conceivably adverse conditions. With the combination of the rugged and steady state ability of the Gunn diode enhanced by the attainment of fine-tuned frequencies with the coupled varactor diode element, this apparatus achieves fine tuning results heretofore attainable only with great difficulty in circuits of this type.

Figure 3:
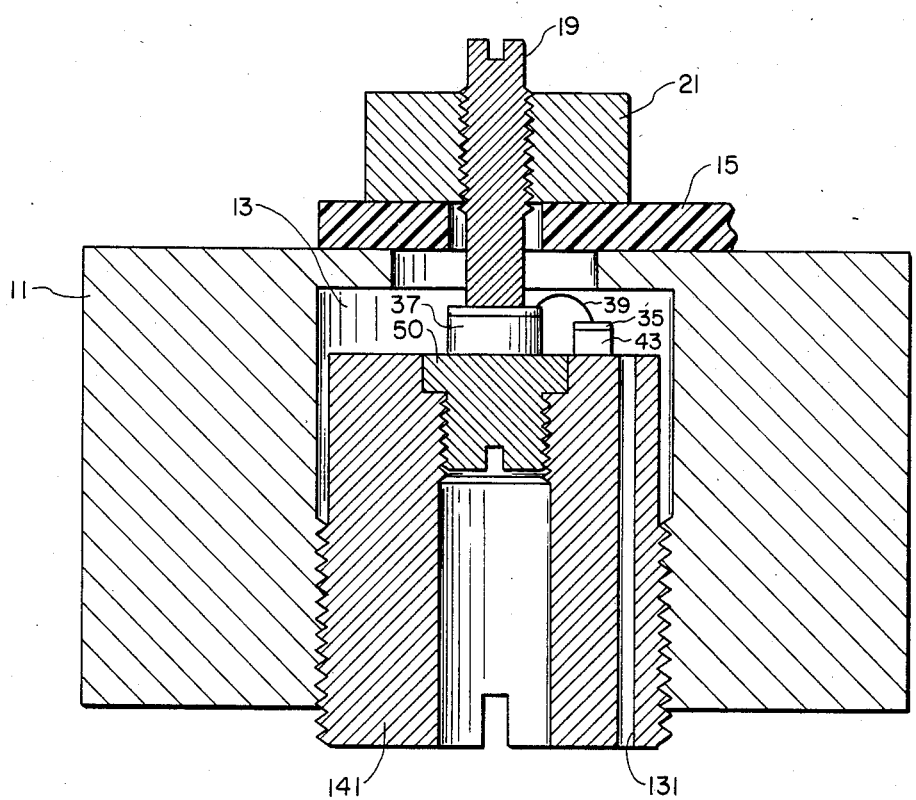
FIG. 3 is an elevational-sectional view through an alternative embodiment of apparatus according to the invention showing the parts mounted in housing in a similar manner to that shown in FIG. 1 of the drawing.

An alternative embodiment of apparatus according to our invention is shown in FIG. 3 of the drawing. Numerical designations identical to those used earlier identify parts which are the same as those described hereinabove. In the embodiment shown in FIG. 3, however, the cylindrical resonating cavity 13 and the cavity bottom closure cylinder 141 is formed of a single diameter piece which is threaded but not provided with any shoulder. The cavity bottom closure cylinder 141 is provided with a single elongate bore 131 extending longitudinally therethrough to accomodate the coaxial cable 23 used to bias varactor diode 35 instead of the configuration in the main embodiment described hereinabove. In all other respects, the structure and embodiment shown in FIG. 3 is the same as that described earlier hereinabove.

BEST MODE

In a preferred embodiment or best mode of practicing our invention, we have, in accordance with the foregoing description, provided a Gunn diode having an overall diameter in the order of 0.09 inch, arranged and disposed in a rectangular form brass heat sink 0.500 inch thick, 1.25 inches long, and 0.75 inch wide. The brass heat sink 11 is bored to an initial or outer large diameter 0.375 inch and an inner diameter of 0.25 inch. The smaller diameter resonating cavity portion of the assembly is topped by 0.015 inch thick flanges extending inwardly to define a 0.118 diameter center hole in which the Gunn diode structure is centrally disposed. The Gunn diode 37 is mounted on mount 50 which is 0.116 inch upper diameter which allows 0.067 inches for insulator 43. The power output plate 15 is of dielectric silicon 0.020 inch thick provided with a bore hole 0.118 inch diameter suitable for registration with the assembly as shown in FIG. 1 of the drawing. The insulator block upon which the varactor diode 35 mounts is an alumina or the like block measuring 0.050 inch ×0.050 inch ×0.010 inch thick, and the coaxial cable used is approximately 0.025 inch outer diameter.

With this arrangement, and an air gap setting of approximately 0.065 inch between the under surface of the resonating cavity top flange and the planar bottom wall defined by the upper surface of the cavity bottom closure 41, the oscillator can be easily maintained at 60 GHz operation by fine-tuning with the bias control of the varactor diode.

In using the embodiment of apparatus illustrated in FIG. 3 of the drawing, and with a resonating cavity height of 0.070 inch between the underside of the cavity top flange and the planar circular surface of the resonating cavity bottom closure 141, 60 GHz operation may also be maintained precisely and over suitably long periods of time by minor adjustments on the varactor diode bias voltage, if necessary.

In light of the foregoing disclosure and discussion it is conceivable that workable alternative embodiments will occur to persons familiar with the art, albeit with such alternative modes well within the spirit of the invention. It is intended therefore that the foregoing description according to our invention be viewed as illustrative only and not construed in any limiting sense, it being our intention to define and limit the invention by the appended claims.

What is claimed is:

1. An oscillator comprising, in combination
    a housing having a resonating cavity;
    a solid state mechanically tunable element adjustably disposed interiorly of said housing and extending contentrically through said cavity, capable of producing a waveform energy output of a frequency relative to its position in said resonating cavity;
    a solid state electronically tunable element in circuit with and mounted proximally of said mechanically tunable element;
    position adjustment means on said mechanically tunable element operably accessible exteriorly of said housing;
    electrical bias sources operably connected respectively to each of the said tunable elements;
    bias variation control means to controllably vary the bias on at least the solid state electronically tunable element; and
    millimeter wave length conductive circuit means arrayed and disposed to conduct generated waveform energy exteriorly of the oscillator.

2. Apparatus according to claim 1 wherein the solid state mechanically tunable element is threadedly engaged in the housing and is moveable therein to vary the volume of the resonating cavity.

3. Apparatus according to claim 1 wherein said said solid state mechanically tunable element is a Gunn diode.

4. Apparatus according to claim 1 wherein said solid state electronically tunable element is a varactor diode.

5. Apparatus according to claim 1 wherein said solid state mechanically tunable element is a Gunn diode, and said solid state electronically tunable element is a varactor mounted interiorly of said housing.

6. Apparatus according to claim 5 wherein said varactor is mounted atop an adjustably moveable cylinder element having a top surface which defines a bottom wall of the resonating cavity.

7. A mechanically tunable voltage controlled millimeter wavelength oscillator comprising, in combination;
    a housing having a bore suitable to define the cylindrical side wall of a resonating cavity;
    a cylindrical resonating cavity bottom closure adjustably longitudinally moveable in and disposed concentrically in said bore;
    a Gunn diode mounted atop the housing, extending concentrically into the resonating cavity with one of its diode elements mounted on and adjustably moveable with said cylindrical resonating cavity bottom closure;
    a varactor diode mounted on the resonating cavity bottom wall defining surface of said cylindrical bottom closure;
    electrical bias sources circuit connected respectively to the Gunn diode and the varactor diode;
    bias variation control means to controllably vary the bias on the varactor diode; and
    a generated energy wave conductor power take-off means mounted on said housing, communicating between the resonating cavity and the exterior of the oscillator.

* * * * *

UNITED STATES PATENT AND TRADEMARK OFFICE
CERTIFICATE OF CORRECTION

PATENT NO. : 4,588,966

DATED : May 13, 1986

INVENTOR(S) : ROBERT E. HORN, HAROLD JACOBS, HSIEH T. HOA

It is certified that error appears in the above—identified patent and that said Letters Patent is hereby corrected as shown below:

On the cover page:

Item 75

Delete third (3rd) named inventor "HSIEH T. HOA" and

Insert --EDMUND E. MALECKI--

Signed and Sealed this

Twenty-third Day of December, 1986

Attest:

DONALD J. QUIGG

Attesting Officer    Commissioner of Patents and Trademarks